(12) United States Patent
Yochai

(10) Patent No.: US 10,977,180 B2
(45) Date of Patent: Apr. 13, 2021

(54) HIT-BASED ALLOCATION OF QUOTAS OF A CACHE SPACE OF A CACHE MEMORY

(71) Applicant: INFINIDAT LTD., Herzliya Pituach (IL)

(72) Inventor: Yechiel Yochai, Lehavot Haviva (IL)

(*) Notice: Subject to any disclaimer, the term of this patent is extended or adjusted under 35 U.S.C. 154(b) by 0 days.

(21) Appl. No.: 16/458,215

(22) Filed: Jul. 1, 2019

(65) Prior Publication Data

US 2021/0004329 A1    Jan. 7, 2021

(51) Int. Cl.
*G06F 12/0871* (2016.01)
*G06F 3/06* (2006.01)
*G06F 30/20* (2020.01)

(52) U.S. Cl.
CPC ........ *G06F 12/0871* (2013.01); *G06F 3/0611* (2013.01); *G06F 3/0644* (2013.01); *G06F 3/0679* (2013.01); *G06F 30/20* (2020.01); *G06F 2212/1021* (2013.01)

(58) Field of Classification Search
CPC ............. G06F 12/0871; G06F 12/6042; G06F 2212/1021; G06F 2212/604; G06F 3/0611; G06F 3/0644
See application file for complete search history.

(56) References Cited

U.S. PATENT DOCUMENTS

| | | | | |
|---|---|---|---|---|
| 9,372,825 B1* | 6/2016 | Shee | .................. | G06F 15/17331 |
| 2003/0088739 A1* | 5/2003 | Wilkes | .................. | G06F 12/122 |
| | | | | 711/133 |
| 2006/0085597 A1* | 4/2006 | McNeill, Jr. | ........... | G06Q 20/14 |
| | | | | 711/118 |
| 2014/0156910 A1* | 6/2014 | Uttamchandani | ..... | G06F 3/0685 |
| | | | | 711/103 |
| 2014/0325161 A1* | 10/2014 | Voigt | .................. | G06F 11/3466 |
| | | | | 711/136 |
| 2015/0081981 A1* | 3/2015 | McKean | ............... | G06F 12/123 |
| | | | | 711/136 |

OTHER PUBLICATIONS

Chakraborty, L. and A. Singh, "A Utility-based Approach to Cost-Aware Caching in Heterogeneous Storage Systems," 21th International Parallel and Distributed Processing Symposium (IPDPS 2007), Proceedings, Mar. 26-30, 2007.*

(Continued)

*Primary Examiner* — Tracy A Warren
(74) *Attorney, Agent, or Firm* — Reches Patent

(57) ABSTRACT

A method, storage system and non-transitory computer readable medium. The method may include receiving or generating, and for each storage entity out of multiple storage entities of the storage system, a storage entity distribution of cache hits over a caching period related to cached data associated with the storage entity and determining an allocation of quotas of the cache space to the multiple storage entities. The determining may include: (a) for each storage entity, determining a hit score indicative of a number of cache hits per a caching sub-period of the caching period related to the storage entity; (b) simulating, in an iterative manner, an allocation of quotas of the cache space to the storage entities that substantially maximizes the number of cache hits; and (c) allocating quotas of the cache space to the storage entities of the multiple storage entities, based on an outcome of the simulation.

11 Claims, 7 Drawing Sheets

| Quantum # | 1st storage entity | | 2st storage entity | | Highest number of hits | Quantum is assigned to storage entity # |
|---|---|---|---|---|---|---|
| | Examined Time period | Hits# | Examined Time period | Hits# | | |
| 1 | 1 | 8000 | 1 | 9000 | 9000 | 2 |
| 2 | 1 | 8000 | 2 | 5800 | 8000 | 1 |
| 3 | 2 | 7500 | 2 | 5800 | 7500 | 1 |
| 4 | 3 | 6000 | 2 | 5800 | 6000 | 1 |
| 5 | 4 | 4500 | 2 | 5800 | 5800 | 2 |
| 6 | 4 | 4500 | 3 | 2200 | 4500 | 1 |
| 7 | 5 | 3000 | 3 | 2200 | 3000 | 1 |
| 8 | 6 | 2000 | 3 | 2200 | 2200 | 2 |

(56) References Cited

OTHER PUBLICATIONS

Li, Y., Feng, D. and Z. Shi, "An Effective Cache Algorithm for Heterogeneous Storage Systems," The Scientific World Journal, 2013.*

Heterogeneous-aware cache partitioning: Improving the fairness of shared storage cache, Parallel Computing 40 (2014) pp. 710-721.*

* cited by examiner

| Quantum # | 1st storage entity | | 2st storage entity | | Highest number of hits | Quantum is assigned to storage entity # |
|---|---|---|---|---|---|---|
| | Examined Time period | Hits# | Examined Time period | Hits# | | |
| 1 | 1 | 8000 | 1 | 9000 | 9000 | 2 |
| 2 | 1 | 8000 | 2 | 5800 | 8000 | 1 |
| 3 | 2 | 7500 | 2 | 5800 | 7500 | 1 |
| 4 | 3 | 6000 | 2 | 5800 | 6000 | 1 |
| 5 | 4 | 4500 | 2 | 5800 | 5800 | 2 |
| 6 | 4 | 4500 | 3 | 2200 | 4500 | 1 |
| 7 | 5 | 3000 | 3 | 2200 | 3000 | 1 |
| 8 | 6 | 2000 | 3 | 2200 | 2200 | 2 |

FIG. 2

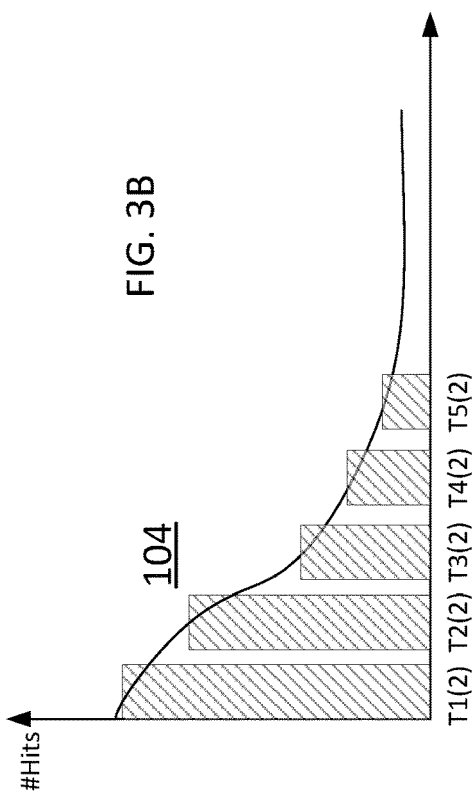
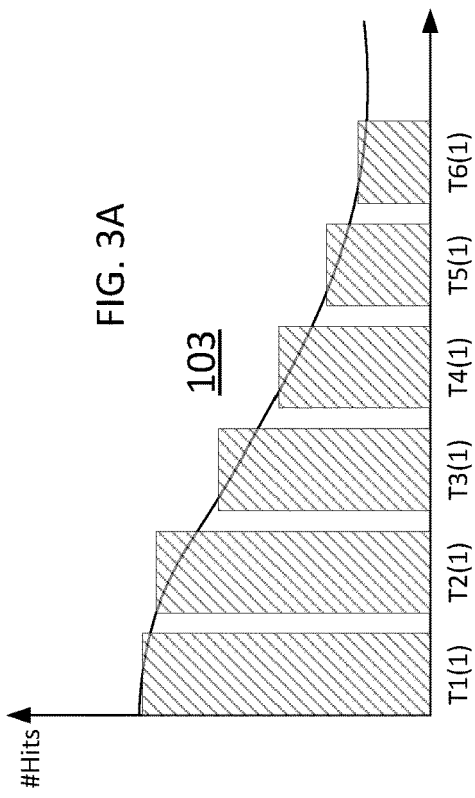

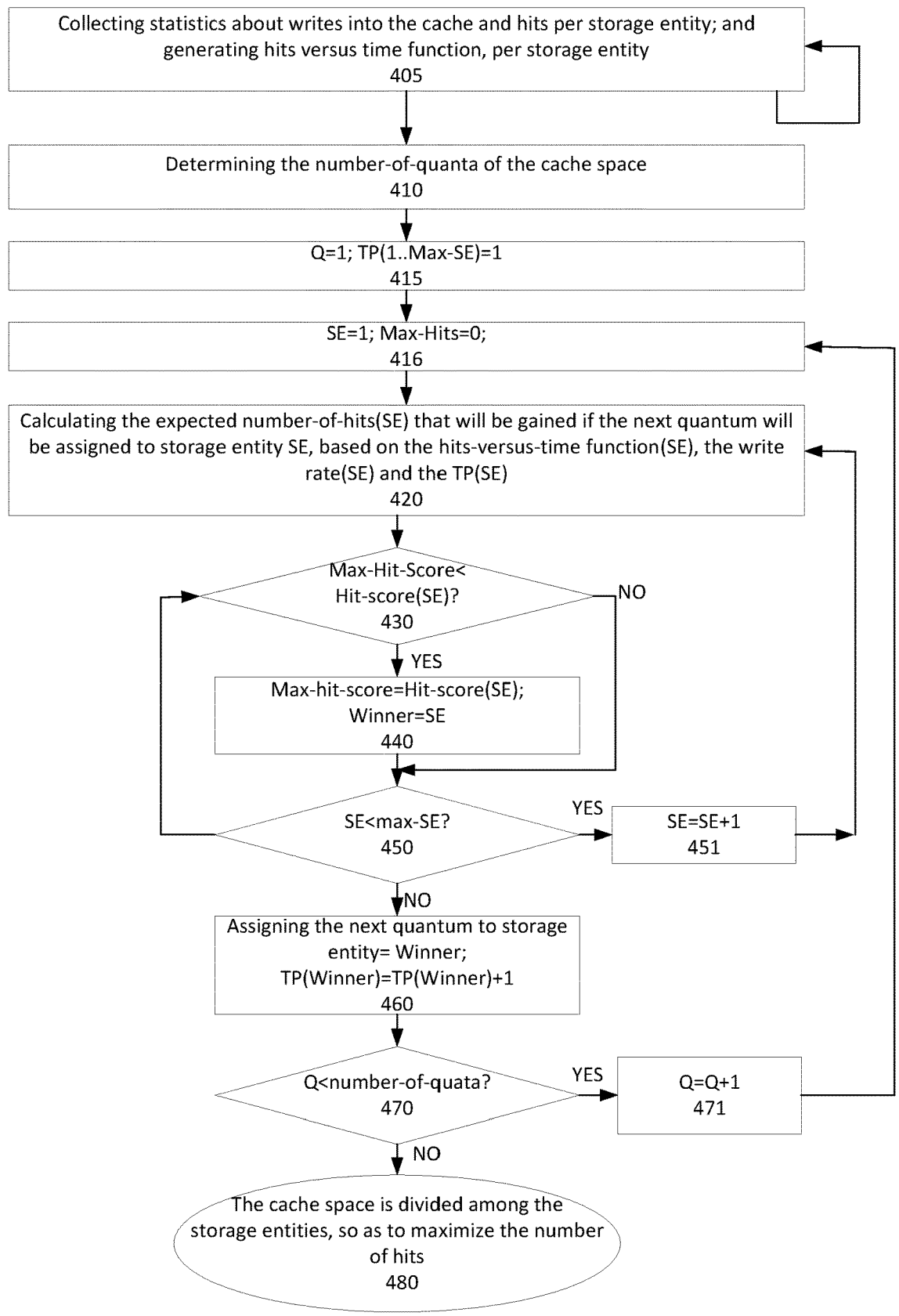
FIG. 4        400

HIT-BASED ALLOCATION OF QUOTAS OF A CACHE SPACE OF A CACHE MEMORY

BACKGROUND

Cache memories (hereinafter—cache) are used for storing active data so as to shorten data access times and reduce latency of I/O operations. A cache stores data that is likely to be accessed, for example the most frequently used data, the most recently used data, and data determined to be accessed according to access patterns detected by prefetch algorithms.

The efficiency of storing data in the cache can be measured by monitoring the number of hits towards the data, i.e., the number of access requests towards the data, that found the data in the cache, rather than needing to read the requested data from the permanent and slower storage device.

The number of hits towards a specific stored data may change over time that the data is cached, and may show different behavior of distribution of the hits over time towards data units that belong to different storage entities.

SUMMARY

There may be provided a method, a storage system and a non-transitory computer readable medium product as illustrated in the specification and/or the claims and/or the drawings.

SUMMARY

Method, storage system and non-transitory computer readable medium as substantially illustrated in the specification and/or the drawings and/or the claims.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates a table that describes the decisions made in each of the eight iterations for assigning the eight slices of cache;

FIGS. 3A and 3B illustrate examples of distributions of cache hits over time;

FIG. 4 illustrates an example of a method;

DETAILED DESCRIPTION OF THE DRAWINGS

Figure 1A:
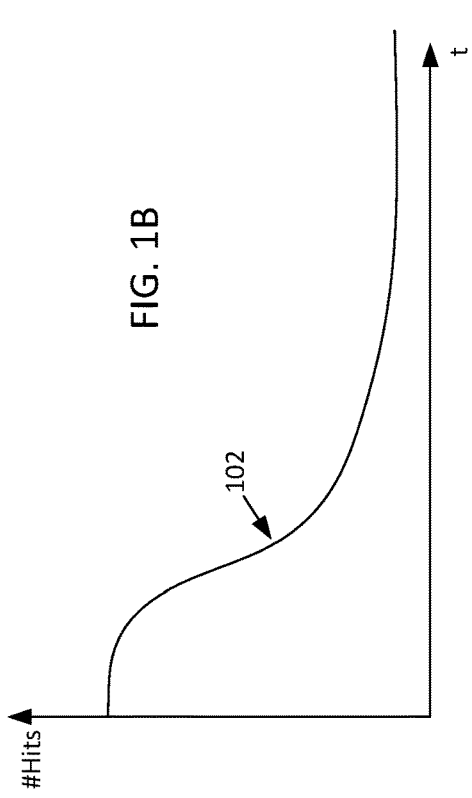
FIGS. 1A, 1B, 1C and 1D illustrate examples of distributions of cache hits over time.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium product that stores instructions that once executed by a computer result in the execution of the method.

Any reference in the specification to a system should be applied mutatis mutandis to a method that may be executed by the system and should be applied mutatis mutandis to a non-transitory computer readable medium product that stores instructions that may be executed by the system.

Any reference in the specification to a non-transitory computer readable medium product should be applied mutatis mutandis to a system capable of executing the instructions stored in the non-transitory computer readable medium product and should be applied mutatis mutandis to method that may be executed by a computer that reads the instructions stored in the non-transitory computer readable medium.

The following terms may have the following meanings:
a. Storage entity—may refer to a volume, a group of volumes, a portion of a volume, a group of data units stored in different volumes of the storage system and having similar characteristics, a group of data units, from different volumes, that were written into the cache by access requests having certain common characteristics, etc.
b. Medium-term—medium term refers to a period that well exceeds a duration of a single case access operation but is smaller than a month or a year. Medium term may range, for example, between 30 minutes and few days.

The system, non-transitory computer readable medium and method of the present application are used for allocation of cache resources by virtually divide the cache space among different storage entities, in order to maximize the total number of hits of cached data.

A certain amount of the cache space is assigned to each storage entity of different storage entities, based on expected hit scores of the storage entities, produced for data stored in the assigned cache space, while taking into account the way the hit score changes over time, as cached data ages in the cache.

The cache space is divided into virtual slices of a fixed size (quotas) and assigned in an iterative manner, slice by slice, wherein during each iteration, a slice (quota) is assigned to the storage entity that will benefit the most from the currently assigned quota, when using the assigned quota for caching data of the storage entity.

The storage entity that receives the assigned quota is the one that is expected to experience maximum hits (among all storage entities) for its cached data when using the quota. The winning storage entity (that received the currently assigned quota) may be assigned with additional quotas in subsequent iterations.

The iterative process of dividing the cache space, slice by slice, is continued until the entire cache space is assigned to the different storage entities. Eventually, each storage entity will be assigned with a different number (Q) of slices, where Q is based on a behavior of hits distribution over caching time, that characterizes the storage entity, as will be set forth hereinafter. There may be storage entities that are not assigned with any quota (Q=0) and will not be allowed to cache data, as caching does not improve hits number for these storage entities.

The process takes into account the distribution of hits over caching time of each storage entity, wherein the caching time is counted from the time the data is written into the cache. The distribution of hits over caching time relates to the changing in the number of hits per time unit as cached data ages.

Figure 1B:
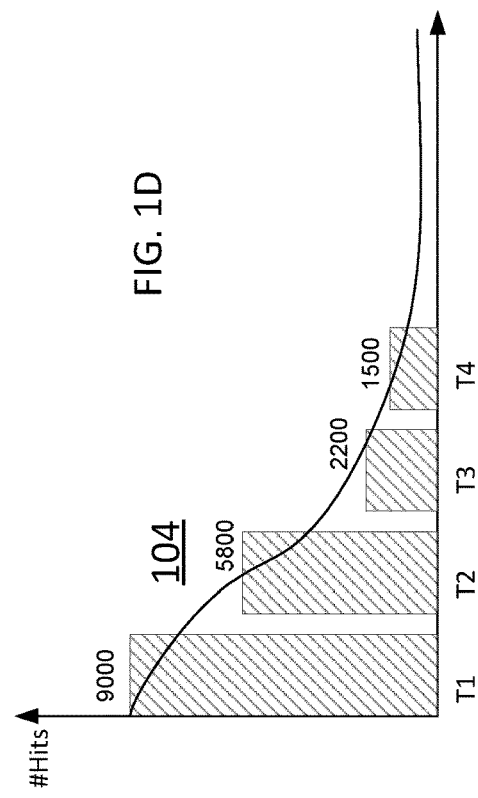

The behavior of this distribution may vary among different storage entities, as can be observed in FIGS. 1A and 1B that illustrate different distribution types for two different storage entities. This distribution over caching time (also referred to as "caching period") generally shows declining in the hits, as illustrated by curves 101 and 102 of FIGS. 1A and 1B, but in some cases the number of hits may be increased. Therefore, an additional quota that is assigned to a storage entity that was already assigned with a previous quota in a previous iteration of the cache division process, is usually expected to produce less hits (or a different number of hits) than the previous assigned quota.

The explanation for these changes in quota utilization as more quotas are assigned, is as follows. If the storage entity would use only one quota of the cache space, then after a certain time period, when the quota is exhausted, the data cached in this quota is evicted for storing new incoming data. During the next time period, the new incoming data will experience a first number of hits that is similar to the number of hits experienced in the previous time period by the evicted data, since this number of hits is typical for newly cached data of this storage entity. However, if a second quota is assigned to the same storage entity, then the previous data does not have to be evicted. The previous data, which has now aged as a time period has passed, experiences a second number of hits (declined number of hits, or a different number of hits), as dictated by the hit distribution, for the second time period. Therefore, assigning the second quota to the storage entity, is expected to contribute the second number of hits.

The process of dividing the cache space also takes into account that cached data of different storage entities may experience different distribution of hits over caching time. Some storage entities may have most of the hits in the first few hours after the data has been cached, while for other storage entities, it may take longer until the hits become negligible.

FIG. 1A shows a curve 101 of a function of hits over time that is observed for a first storage entity and FIG. 1B shows a curve 102 of a function of hits over time that is observed for a second storage entity. The time is counted from the time of writing the data into the cache (start time of caching).

The area under the curve is indicative of the number of hits towards the data of the corresponding storage entity. The number of hits may refer to hits towards data of a size of a quota. For example, the area bounded by t1, t2 and the curve is indicative of the number of hits that occurred during the time period between t1 and t2, and may be calculated by applying an integral over the function limited by t1 and t2.

It is shown that the curve 101 of the hits over time as observed for the first storage entity declines slower than the curve 102 of the hits over time as observed for the second storage entity.

Figure 1C:
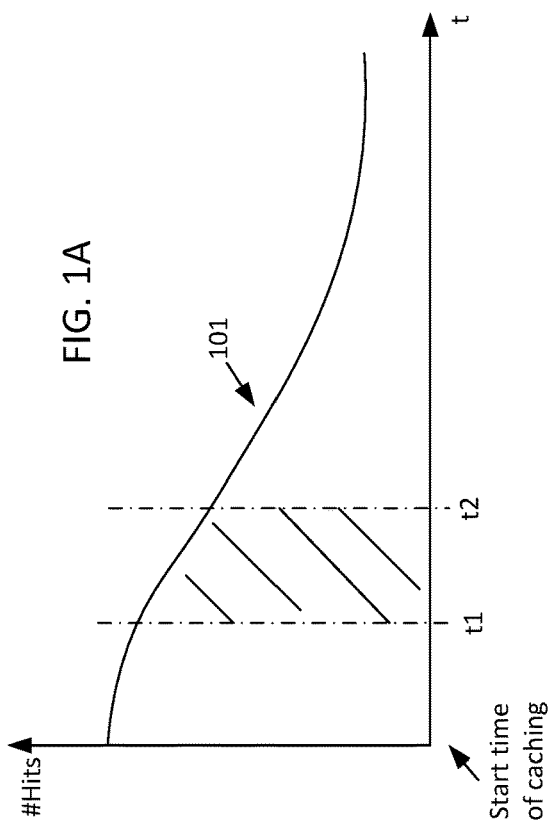
Figure 1D:
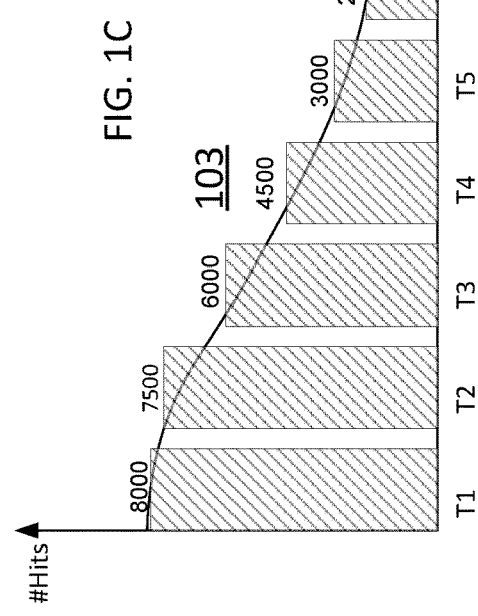

For the sake of simplicity, in FIGS. 1C and 1D, curves 101 and 102 are represented as histograms 103 and 104, where each bar represents the hits during a time period (T1, T2, . . . , T6, where T1 is the time period that follows the start of caching), which can be calculated by the area of each bar. The number of the hits is written above each bar.

FIG. 1C shows the hit number per time period of the first storage entity. In this example, the hit number represents hits towards data of a size of a quota. During the first time period T1 that data of a size of a quota of the first storage entity is cached, it can gain 8000 hits. According to FIG. 1D which shows the hit number per time period of the second storage entity, during the first time period T1 that data of a size of a quota of the second storage entity is cached, it can gain 9000 hits.

For the sake of simplicity, the following example assumes that there are only two storage entities in the storage system, but the number of storage entities is much higher and can reach hundreds, thousands, tens of thousands and more. The example also assumes that the cache space is divided into eight slices that are assigned to the storage entities, though generally the number of slices is much higher.

For the sake of simplicity, in the following example, the "number of hits" expected during a certain time period is compared among all storage entities. However, the value being compared may be a hit score, which is indicative of the number of hits, but may be normalized while taking into account other factors, such as the rate of writing new data into the cache, by the different storage entities.

In the first iteration of the division process of the cache space, when the first quota of the cache space is assigned, the number of hits expected during the first time period that succeed the start of caching is checked for all the storage entities and the storage entity expected to have the highest number of hits is selected. In this example, the first quota of cache space is assigned to the second storage entity, as it has a potential of 9000 hits versus 8000 hits of the first storage entity.

FIG. 2 illustrates a table that describes the decisions made in each of the eight iterations for assigning the eight slices of cache.

In the second iteration, when the second quota of the cache space is assigned, the number of hits during the next examined time period is checked for all the storage entities. In the second to eighth iterations, the examined time period may be different for each storage entity. The examined time period for a certain storage entity is the time period that follows the time period whose calculated hit number participated in a previous determination that resulted assigning a quota to the certain storage entity. In this example, time period T1 is the "examined time period" for the first storage entity while time period T2 is the "examined time period" for the second storage entity that was already assigned with a quota, based on its potential performance during time period T1. The highest number of hits, among all examined time periods of the corresponding storage entities is selected. On examined time period T1 of the first storage entity, 8000 hits are expected, while on examined time period T2 of the second storage entity, 5800 hits are expected. The second quota of cache space is assigned to the first storage entity, as it has a potential of 8000 hits.

As shown in the table of FIG. 2: in the third iteration, when the third quota of the cache space is assigned, time period T2 of the first storage entity, has a potential of resulting 7500 hits and the time period T2 of the second storage entity, has a potential of resulting 5800 hits. Therefore the third quota is assigned to the first storage entity.

Proceeding with the same logic: the fourth quota is assigned to the first storage entity; the fifth quota is assigned to the second storage entity; the sixth and seventh quotas are assigned to the first storage entity; and the eighth quota is assigned to the second storage entity.

At the end of the iterations of the cache division process, 5 quotas, or a portion of ⅝ of the cache space is assigned to the first storage entity and a portion of ⅜ of the cache space is assigned to the second storage entity.

For the sake of simplicity, the time periods were illustrated in the examples of FIGS. 1C-1D as having the same lengths for both storage entities. However, the length of the time periods should be dependent on the pace that the storage entities add new data into the cache. The cache quota that is assigned to a certain storage entity is written with new data using a certain write rate that is typical to the storage entity. Different storage entities may be characterized by different write (into the cache) rates. The write rate (or caching rate) is dictated by I/O requests (access activity) related to the storage entities, and is not related to a physical writing rate of a device. The time when the space defined by the quota is fully written, defines the end of a time period and the start of the next time period. At this point in time, the storage entity may need to use an additional quota (or otherwise overrides its oldest cached data).

Therefore, the write rate and the quota size dictates the length of the time periods. For example, if the quota size is 100 Mbytes and the certain storage entity writes into the cache 200 Mbytes per hour, then the time periods of the certain storage entity should be of 30 minutes (quota size divided by the write-rate). If otherwise, the certain storage entity writes into the cache 100 Mbytes per hour then the time periods should be of two hours.

FIGS. 3A and 3B illustrates histograms similar to those illustrated in FIGS. 1C and 1D, except that the time periods T1(2)-T5(2) of the second storage entity are narrower than the time periods T1(1)-T6(1) of the first storage entity. This is due to the faster write rate of the second storage entity compared to the write rate of the first storage entity. The second storage entity consumes a quota faster than the first storage entity, therefore the calculation of its hits is performed for shorter time periods.

Write rate—also called fill-up rate, usage rate or caching rate—is the rate that the volume needs to write data to the cache (not the physical rate).

The following example will show that even storage entities that have a similar hits versus caching time behavior, may still be assigned with a different number of quotas (Q), if they have different write rate.

Assuming that it takes for a certain storage entity a time period of e.g., 1 hour, to fill up an assigned single quota, then this storage entity will need another quota only in the second hour. No hits will be gained if it receives a second quota before the end of the hour, since it has no data needed to be cached, or can still use the first quota.

Therefore an integral over 1 hour will produce the expected hits of the first quota.

For the second quota—an integral over the second hour of the graph (the point in time when the first quota is exhausted and a second quota may gain hits) is performed for estimating the expected hits for the second quota.

FIGS. 3C and 3D illustrate two storage entities with the same graph, but different usage rate $T(1)=2\times T(2)$: (the number within the bars—are the hits #provided by integral over the time period).

Under this assumption the allocation of quotas (assuming six quotas to allocate) will be: T1(1), T2(1), T3(1), T1(2), T4(1), T2(2)—accordingly—four quotas for the slower volume and two quotas for the faster volume. Therefore, even storage entities that have a similar distribution of hits versus caching time, may still be assigned with a different number of quotas (Q), if they have different write rate.

In order to support the process of dividing the cache space among the storage entities, the system collects statistics and generate information about the distribution of hits over time, based on the statistics, per each storage entity. The hits-over-time information may be stored, for example, as a histogram, i.e., bins that counts hits per time period.

The process of collecting cache hit statistics and generating the histograms precedes the process of dividing the cache. Once the histograms are ready for being used by the process of dividing the cache capacity, the statistics collection and the updating of the histograms is continued in the background, continuously or periodically.

Along with the process of collecting cache hit statistics and generating the histograms, the system further monitor the writes into the cache of each storage entity, and calculate the write rate of each storage entity, which is used for determining the different time period lengths of the storage entities, which further facilitates calculating the hit number (the area under the curve, or the area of the histogram bars). The average write rate is updated periodically.

The monitoring of the write rate and the hits over time distribution may be done by monitoring the data in the cache. Otherwise the monitoring may use a ghost cache so as to avoid wasting cache space. The ghost cache may store only metadata of data to be cached, so that hit statistics can be gathered for a longer time period, using only the metadata of pseudo cached data, without storing actual data. The data cached in the physical cache may be evicted from the cache earlier than the pseudo cached data in the ghost cache due to space limitation. Another option is continuing storing a sample of the data of each storage entity for longer time than the majority of the data.

The process of dividing the cache space may be repeated periodically, so as to adapt to changes in the curves of the hit over time functions or changes in the write rates. Alternatively, the need to repeat the process of dividing the cache space may be reviewed periodically, in view of the dynamic nature of the cache behavior of different storage entities. Another option for activating the process of dividing is upon detecting changes in hit over time distributions or changes in the write rates that may influent the maximal number of hits.

FIG. 4 illustrates a method 400 for assigning the capacity of a cache memory to different storage entities, so as to maximize the total number of hits in the cache memory.

Method 400 may include a step 405 for collecting statistics about writes into the cache and hits over caching time, per storage entity; and generating information indicative of hits over caching time, per storage entity. Step 405 may include calculating the write rate of writing data into the cache, per storage entity.

Method 400 may include step 410 of determining the number-of-quotas of the cache space. The number of quotas is based on the number of storage entities, so that each storage entity will be assigned with several quotas so as to cover different parts of the hits over time function, particularly the parts that contributes to the number of hits. If for example, the number of storage entities is 10000 and it is assumed that the average slices per storage entity should be five, then the number of assigned quotas is 50000. The number-of-quotas may be further based on at least one of the parameters: the cache size, the size of data units stored in the cache, the write rates (average, maximum, minimum, etc), and so on.

Once the initial information of the hits over caching time is ready, (i.e., the statistics cover at least few hours of information of cached data, or the statistics cover information until the functions decay to nearly zero), the process of dividing the cache space can begin.

Step 415 sets the iteration parameter for iterating the quotas (Q) to 1, and resetting the time periods of all the storage entities, for example: a TP (Time Period) parameter of all the storage entities is set to 1, so as to indicate starting the iterations from a first time-period for all storage entities. Alternatively, the start times (=0) and the end times of the first time periods can be set.

The iterations over all the quotas start with step 416 of setting the variable SE (Storage Entity) to 1, and resetting the variable max-hits.

Step 416 is followed by the iterating over all the storage entities for finding the one that is expected to produce the maximum number of hits, starting with step 420 of calculating the expected hit score of the next storage entity SE, that will be gained if the next quota will be assigned to storage entity SE, based on the hits-over-time information, and during the time-period to be checked (TP) of storage entity SE. The hit score is indicative of the number of hits expected to occur if the next quota will be assigned to storage entity SE, and may be further based on the quota size, on the write rate of the storage entity, etc. For example, higher write rates may reduce the hit score.

Step 420 is followed by step 430 of checking whether the max-hits-score variable needs to be replaced with the hit score calculated in step 420 (Max-Hits-Score<hit-score(SE)?).

If the answer is yes then step 430 is followed by step 440, otherwise step 430 is followed by step 450.

Step 430 includes replacing the value of the Max-Hits-Score variable with the hit score calculated in step 420, and set the variable "winner" to the current value of SE.

Step 440 is followed by step 450 of checking whether there are more storage entities to be checked (SE<max–SE). If the answer is yes, then step 450 is followed by step 451 of incrementing the variable SE and continuing to check the next storage entity.

If the answer is no, step 450 is followed by step 460 of assigning the next quota to the storage entity that is indicated by the variable "Winner", and incrementing the time-period (to be examined in the next iteration of assigning a quota) of the "winner" storage entity (TP(Winner)=TP(Winner)+1).

Step 460 is followed by step 470 of checking whether there are more quotas to assign (Q<number-of-quota?). If the answer is yes, then step 470 is followed by step 471 of incrementing the variable Q and iterating the process for the next quota.

If the answer is no—then all the quotas were allocated, and the cache space is now divided among the storage entities, so as to maximize the number of hits in the cache (480).

The number of quotas assigned to each storage entity further dictates the duration of data caching, i.e., the time from writing the data into the cache until the eviction of the data. The caching duration is further dependent on the size of the quotas and on the write rate into the cache. For example, a certain storage entity is assigned with N (e.g., 4) quotas of size S (e.g., 100 Mbytes each), and having an average write rate of W (e.g., 50 Mbytes/hour). The caching duration of data that was written into the cache by the certain storage entity is: N*S/W=4*100/50=8 hours. Each quota will allow caching the data for another S/W=2 hours.

Figure 5:
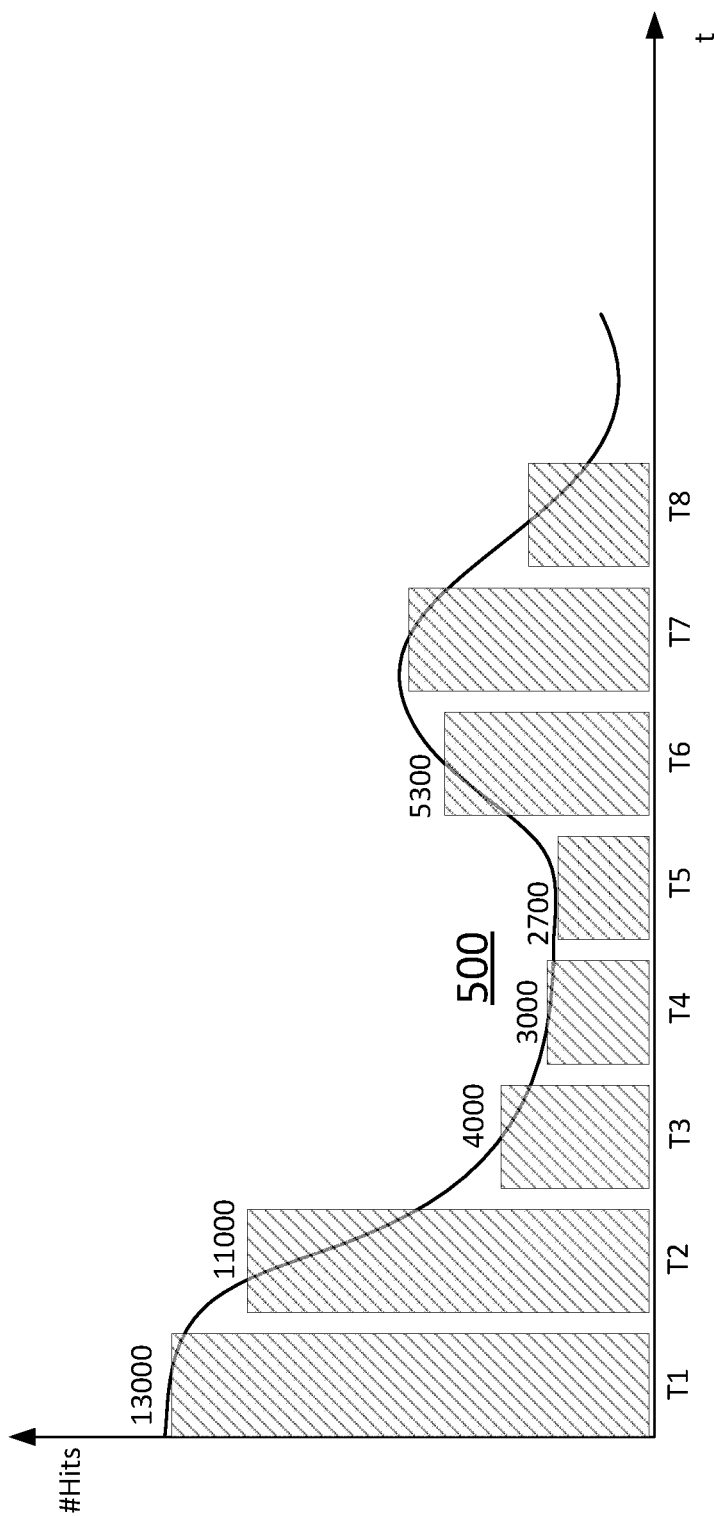
FIG. 5 illustrates an example of distributions of cache hits over time.

FIG. 5 illustrates a different behavior of the hits over time distribution, where the curve declines until T5, and then the hit activity recovers. According to an embodiment of the invention, that takes into account a possibility of recovering of the hits of cached data of a certain storage entity, the hit score that is calculated should be adapted to this possibility. For example, the fourth time period (or any other time period), may be calculated differently, taking into account the contribution of the subsequent time periods.

More than one hit scores may be calculated. A first hit score corresponds to the fourth time period, which contributes 3000 hits. Then, it can be determined that the subsequent time periods can contribute more than the current examined time period and it may be beneficial to win another quotas, in spite of the low first hit score. The determination can be made, for example, by calculating an average of the hit scores of the next several time periods, and compare the average to the first hit score. If the average on one or more subsequent hit scores exceed the first hit score, then it is determined that the subsequent time periods can contribute more than the current examined time period. For example, the average hits of time periods T4, T5 and T6 is 3600, which is larger than the number of hits of time period T4 alone. The average may be a weighted average, giving different weights to different time periods.

In this case, one or more alternative hit scores can be calculated by giving a weight to each time period of: the examined time period and one or more subsequent time periods, and calculate the weighted average. This alternative hit score will be compared to the hit scores of other storage entities.

Therefore, step 420 of method 400 may calculate the hit score based on more than one time period, and if this alternative hit score will win in the comparison, then step 460 will increment TP(Winner) by a counter that reflects the number of participating time periods (e.g., 3).

When the winning hit score is an alternative hit score that is based on multiple time periods, then the quota assigned in response to the alternative hit score, will need to serve cached data during the multiple time periods, using the weights used for the average for determining the portion of data that will be cached for several durations. For example, 60% of the data that corresponds to the fourth quota may be cached for 4 time periods, while 40% will be cached for 6 time periods, so that it will experience the increment of the hits in the sixth time period.

Figure 6:
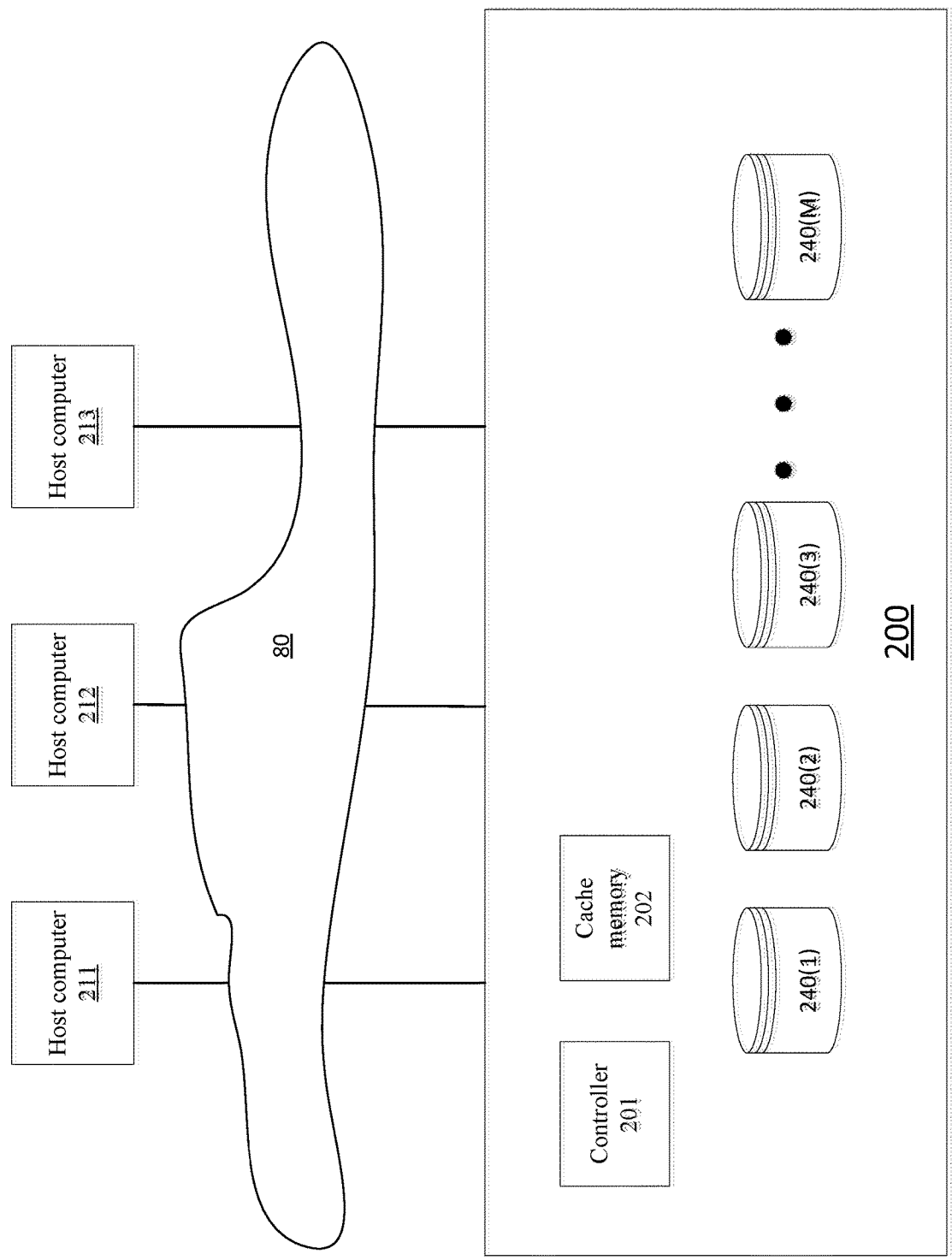
FIG. 6 illustrates an example of a mass storage system and its environment.

FIG. 6 illustrates a mass storage system 200 and computerized systems such as host computers 211, 212 and 213.

The three host computers may host multiple applications. Each one of the computerized systems and/or the applications may be regarded as an accessing unit.

The host computers are coupled via network 80 to mass storage system 200 that includes permanent storage (represented by physical storage devices such as discs 240(1)-240(M)), cache memory 202, and controller 201. Different logical volumes can be mapped to the physical storage devices of the permanent storage. The controller may be configured to perform any combination of any stages of method 300 of FIG. 7 and/or stages of method 400 of FIG. 4. The controller may include one or more integrated circuits, memory chips, memory elements, processing circuits, one or more hardware controllers, communication elements, one or more general purpose units, one or more graphical processing units, one or more application specific integrated circuits, one or more field programmable gate arrays, and the like. Cache memory 202 may be, for example, a RAM (Random Access Memory) or SSD (Solid State Drive).

Figure 7:
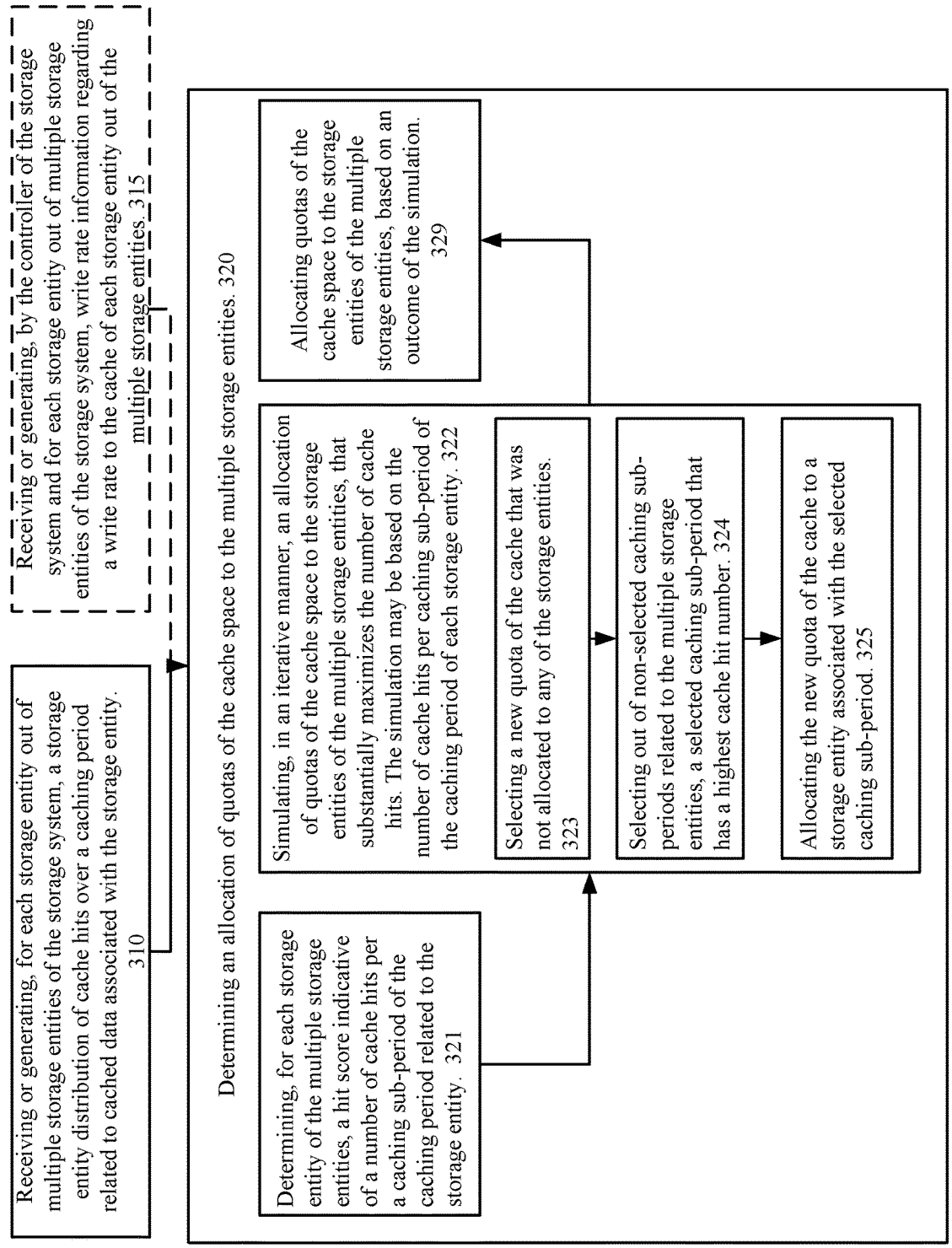
FIG. 7 illustrates an example of a method.

FIG. 7 illustrates an example of method 300 for hit-based allocation of quotas of a cache space of a cache memory of a storage system.

Method 300 may include steps 310 and 320.

Steps 310 and 320 may be executed multiple times—for example in an iterative manner.

Step 310 may include receiving or generating, for each storage entity out of multiple storage entities of the storage system, a storage entity distribution of cache hits over a caching period related to cached data associated with the storage entity. The multiple storage entities may be all the storage entities of the storage system or only a part of the storage entities of the storage system. The storage entity distribution may be calculated by the controller, at least in part by the controller, by a dedicated monitor, and the like.

Step 320 may include determining an allocation of quotas of the cache space to the multiple storage entities. Step 320 may include any combination of any steps of method 400. Step 320 may be executed multiple times during different points of time—in a continuous or non-continuous manner.

Step 320 may include steps 321, 322 and 329.

Step 321 may include determining, for each storage entity of the multiple storage entities, a hit score indicative of a number of cache hits per a caching sub-period of the caching period related to the storage entity. The determining may be based on the distribution of cache hits of each storage entity. The caching period may be divided into multiple sub-periods. The sub-periods may be time periods T1, T2, etc. of FIGS. 1C, 1D, 3A, 3B, or may be other time intervals within the storage entity distribution, such as the time interval t1-t2 illustrated in FIG. 1A.

Step 321 may precede step 322, and in this case—may determine, for each storage entity, multiple hit scores associated with multiple sub-periods, respectively. Otherwise, step 321 may follow step 323, and in this case—may determine, for each storage entity, one hit score for the new quota to be assigned, based on one or more sub-periods of the storage entity.

Step 322 may include simulating, in an iterative manner, an allocation of quotas of the cache space to the storage entities of the multiple storage entities, that substantially maximizes the hit score. The simulation may be based on the hit score per caching sub-period of the caching period of each storage entity. Step 322 may include determining the number of quotas into which the cache space is divided.

Step 329 may include allocating quotas of the cache space to the storage entities of the multiple storage entities, based on an outcome of the simulation.

Step 322 may include steps 323, 324 and 325.

Step 323 may include selecting a new quota of the cache that was not allocated to any of the storage entities. The new quota may be a next quota to be assigned out of the quotas of the cache space.

Step 324 may include selecting out of non-selected caching sub-periods related to the multiple storage entities, a selected caching sub-period that has a highest hit score. The non-selected caching sub-periods includes sub-periods of caching periods of the multiple storage entities that were not selected in a previous iteration of step 324.

Step 325 may include allocating the new quota of the cache to a storage entity associated with the selected caching sub-period.

Method 300 may also include step 315 of receiving or generating, by the controller of the storage system and for each storage entity out of multiple storage entities of the storage system, write rate information regarding a write rate to the cache of each storage entity out of the multiple storage entities.

Step 315 may be followed by step 320. When step 320 is preceded by step 315—the determining of step 320 may be also based on the write rate information related to the multiple storage entities.

Step 315 may include generating the write rate information regarding the write rate to the cache of each storage entity out of the multiple storage; wherein the generating of the write rate information comprises monitoring a shadow cache that stores metadata regarding writes to the cache.

There may be provided a method for hit-based allocation of quotas of a cache space of a cache memory of a storage system, the method may include (a) receiving or generating, by a controller of the storage system and for each storage entity out of multiple storage entities of the storage system, a storage entity distribution of cache hits over a caching period related to cached data associated with the storage entity; (b) and determining an allocation of quotas of the cache space to the multiple storage entities.

The determining may include (a) for each storage entity of the multiple storage entities, determining a hit score indicative of a number of cache hits per a caching sub-period of the caching period related to the storage entity; (b) simulating, in an iterative manner, an allocation of quotas of the cache space to the storage entities of the multiple storage entities, that substantially maximizes the number of cache hits; wherein the simulation may be based on the number of cache hits per caching sub-period of the caching period of each storage entity; and (c) allocating quotas of the cache space to the storage entities of the multiple storage entities, based on an outcome of the simulation.

The simulating of the allocation of quotas of the cache space may include (a) selecting a new quota of the cache that was not allocated to any of the storage entities; (b) selecting out of non-selected caching sub-periods related to the multiple storage entities, a selected caching sub-period that has a highest hit score; and (c) allocating the new quota of the cache to a storage entity associated with the selected caching sub-period.

The caching period may be of medium duration that ranges between few minutes and few days.

The method may include receiving or generating, by the controller of the storage system and for each storage entity out of multiple storage entities of the storage system, write rate information regarding a write rate to the cache of each storage entity out of the multiple storage entities; wherein the determining of the allocation of quotas may be further based on the write rate information related to the multiple storage entities.

The method may include generating the write rate information regarding the write rate to the cache of each storage entity out of the multiple storage; wherein the generating of the write rate information may include monitoring a shadow cache may store metadata regarding writes to the cache.

The method may include repeating the determining of the allocation of quotas of the cache space to the multiple storage entities during the periods of time.

The method may include repeating the determining of the allocation of quotas of the cache space to the multiple storage entities.

The determining of the allocation of quotas may be performed in an iterative manner.

There may be provided a non-transitory computer readable medium may store instructions that once executed by a mass storage system causes the mass storage system to execute the steps of (a) receiving or generating, for each storage entity out of multiple storage entities of the storage system, a storage entity distribution of cache hits over a caching period related to cached data associated with the storage entity; and (b) determining an allocation of quotas of a cache space to the multiple storage entities.

The determining may include (a) determining, for each storage entity of the multiple storage entities, a hit score indicative of a number of cache hits per a caching sub-period of the caching period related to the storage entity; (b) simulating, in an iterative manner, an allocation of quotas of the cache space to the storage entities of the multiple storage entities, that substantially maximizes the number of cache hits; wherein the simulation may be based on the number of cache hits per caching sub-period of the caching period of each storage entity; and (c) allocating quotas of the cache space to the storage entities of the multiple storage entities, based on an outcome of the simulation.

The simulating of the allocation of quotas of the cache space may include selecting a new quota of the cache that was not allocated to any of the storage entities; selecting out of non-selected caching sub-periods related to the multiple storage entities, a selected caching sub-period that has a highest hit score; and allocating the new quota of the cache to a storage entity associated with the selected caching sub-period.

The caching period may be of medium duration that ranges between few minutes and few days.

The non-transitory computer readable medium may store instructions for receiving or generating, by the controller of the storage system and for each storage entity out of multiple storage entities of the storage system, write rate information regarding a write rate to the cache of each storage entity out of the multiple storage entities; wherein the determining of the allocation of quotas may be further based on the write rate information related to the multiple storage entities.

The non-transitory computer readable medium may store instructions for generating the write rate information regarding the write rate to the cache of each storage entity out of the multiple storage; wherein the generating of the write rate information may include monitoring a shadow cache may store metadata regarding writes to the cache.

The non-transitory computer readable medium may store instructions for repeating the determining of the allocation of quotas of the cache space to the multiple storage entities during the periods of time.

The non-transitory computer readable medium may store instructions for repeating the determining of the allocation of quotas of the cache space to the multiple storage entities.

The determining of the allocation of quotas may be performed in an iterative manner.

There may be provided a storage system that may include a cache memory and a controller, wherein the controller may be configured to receive or generate, for each storage entity out of multiple storage entities of the storage system, a storage entity distribution of cache hits over a caching period related to cached data associated with the storage entity; determine an allocation of quotas of the cache space to the multiple storage entities, wherein the determining may include determining for each storage entity of the multiple storage entities, a hit score indicative of a number of cache hits per a caching sub-period of the caching period related to the storage entity; simulating, in an iterative manner, an allocation of quotas of the cache space to the storage entities of the multiple storage entities, that substantially maximizes the number of cache hits; wherein the simulation may be based on the number of cache hits per caching sub-period of the caching period of each storage entity; and allocating quotas of the cache space to the storage entities of the multiple storage entities, based on an outcome of the simulation.

The terms "including", "comprising", "having", "consisting" and "consisting essentially of" are used in an interchangeable manner. For example—any method may include at least the steps included in the figures and/or in the specification, only the steps included in the figures and/or the specification.

The invention may also be implemented in a non-transitory computer readable medium for running on a computer system, at least including code portions for performing steps of a method when run on a programmable apparatus, such as a computer system or enabling a programmable apparatus to perform functions of a device or system according to the invention. The non-transitory computer readable medium may cause the storage system to allocate disk drives to disk drive groups.

A non-transitory computer readable medium is a list of instructions such as a particular application program and/or an operating system. The non-transitory computer readable medium may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The non-transitory computer readable medium may be stored internally on non-transitory computer readable medium product that is non-transitory. All or some of the non-transitory computer readable medium may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the non-transitory computer readable medium and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. more, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for hit-based allocation of quotas of a cache space of a cache memory of a storage system, the method comprises:

receiving or generating, by a controller of the storage system and for each storage entity out of multiple storage entities of the storage system, a storage entity distribution of cache hits over a caching period related to cached data associated with the storage entity, wherein the caching period is a time period during which the cached data, associated with the storage entity, was stored in the cache;

determining an allocation of quotas of the cache space to the multiple storage entities, wherein the determining comprises:

for each storage entity of the multiple storage entities, determining a hit score indicative of a number of cache hits per a caching sub-period of the caching period related to the storage entity distribution of cache hits over the caching period associated with the storage entity;

simulating, in an iterative manner, an allocation of quotas of the cache space to the storage entities of the multiple storage entities, that maximizes the number of cache hits; wherein the simulation is based on the hit score per caching sub-period of the caching period of each storage entity;

wherein the simulating of the allocation of quotas of the cache space comprises multiple iterations for allocating multiple quotas of the cache space, wherein each of the multiple iterations for allocating, comprises:

selecting out of non-selected caching sub-periods related to the multiple storage entities, a selected caching sub-period that has a highest hit score, wherein the non-selected caching sub-periods are caching sub-periods that were not selected in previous iterations; and allocating a new quota of the multiple quotas of the cache space to a storage entity associated with the selected caching sub-period; and allocating quotas of the cache space to the storage entities of the multiple storage entities, based on an outcome of the simulation.

2. The method according to claim 1, comprising receiving or generating, by the controller of the storage system and for each storage entity out of multiple storage entities of the storage system, write rate information regarding a write rate to the cache of each storage entity out of the multiple storage entities; wherein the determining of the allocation of quotas is further based on the write rate information related to the multiple storage entities.

3. The method according to claim 2 comprising generating the write rate information regarding the write rate to the cache of each storage entity out of the multiple storage; wherein the generating of the write rate information comprises monitoring a shadow cache that stores metadata regarding writes to the cache.

4. The method according to claim 1, comprising repeating the determining of the allocation of quotas of the cache space to the multiple storage entities multiple times.

5. The method according to claim 1, comprising repeating the determining of the allocation of quotas of the cache space to the multiple storage entities.

6. A non-transitory computer readable medium that stores instructions that once executed by a mass storage system causes the mass storage system to execute the steps of:

receiving or generating, by a controller of the storage system and for each storage entity out of multiple storage entities of the storage system, a storage entity distribution of cache hits over a caching period related to cached data associated with the storage entity, wherein the caching period is a time period during which the cached data, associated with the storage entity, was stored in the cache;

determining an allocation of quotas of a cache space to the multiple storage entities, wherein the determining comprises:

for each storage entity of the multiple storage entities, determining a hit score indicative of a number of cache hits per a caching sub-period of the caching period related to the storage entity distribution of cache hits over the caching period associated with the storage entity;

simulating, in an iterative manner, an allocation of quotas of the cache space to the storage entities of the multiple storage entities, that maximizes the number of cache hits; wherein the simulation is based on the hit score per caching sub-period of the caching period of each storage entity;

wherein the simulating of the allocation of quotas of the cache space comprises multiple iterations for allocating multiple quotas of the cache space, wherein each of the multiple iterations for allocating, comprises:

selecting out of non-selected caching sub-periods related to the multiple storage entities, a selected caching sub-period that has a highest hit score, wherein the non-selected caching sub-periods are caching sub-periods that were not selected in previous iterations; and allocating a new quota of the multiple quotas of the cache space to a storage entity associated with the selected caching sub-period;

and allocating quotas of the cache space to the storage entities of the multiple storage entities, based on an outcome of the simulation.

7. The non-transitory computer readable medium according to claim 6, that stores instructions for receiving or generating, by the controller of the storage system and for each storage entity out of multiple storage entities of the storage system, write rate information regarding a write rate to the cache of each storage entity out of the multiple storage entities; wherein the determining of the allocation of quotas is further based on the write rate information related to the multiple storage entities.

8. The non-transitory computer readable medium according to claim 7 that stores instructions for generating the write rate information regarding the write rate to the cache of each storage entity out of the multiple storage; wherein the generating of the write rate information comprises monitoring a shadow cache that stores metadata regarding writes to the cache.

9. The non-transitory computer readable medium according to claim 6, that stores instructions for repeating the determining of the allocation of quotas of the cache space to the multiple storage entities during the periods of time.

10. The non-transitory computer readable medium according to claim 6, that stores instructions for repeating the determining of the allocation of quotas of the cache space to the multiple storage entities.

11. A storage system that comprises a cache memory and a controller, wherein the controller is configured to:

receive or generate, for each storage entity out of multiple storage entities of the storage system, a storage entity distribution of cache hits over a caching period related to cached data associated with the storage entity, wherein the caching period is a time period during which the cached data, associated with the storage entity, was stored in the cache;

determine an allocation of quotas of a cache space to the multiple storage entities, wherein the determining comprises:

for each storage entity of the multiple storage entities, determining a hit score indicative of a number of cache hits per a caching sub-period of the caching period related to the storage entity distribution of cache hits over the caching period associated with the storage entity;

simulating, in an iterative manner, an allocation of quotas of the cache space to the storage entities of the multiple storage entities, that maximizes the number of cache hits; wherein the simulation is based on the hit score per caching sub-period of the caching period of each storage entity;
   wherein the simulating of the allocation of quotas of the cache space comprises multiple iterations for allocating multiple quotas of the cache space, wherein each of the multiple iterations for allocating, comprises:
      selecting out of non-selected caching sub-periods related to the multiple storage entities, a selected caching sub-period that has a highest hit score, wherein the non-selected caching sub-periods are caching sub-periods that were not selected in previous iterations; and
allocating a new quota of the multiple quotas of the cache space to a storage entity associated with the selected caching sub-period;
and
allocating quotas of the cache space to the storage entities of the multiple storage entities, based on an outcome of the simulation.

\* \* \* \* \*